(12) United States Patent
Nishinaga

(10) Patent No.: US 7,235,131 B2
(45) Date of Patent: Jun. 26, 2007

(54) METHOD FOR FORMING A SINGLE CRYSTALLINE FILM

(75) Inventor: Tatau Nishinaga, Kashiwa (JP)

(73) Assignee: The University of Tokyo, Tokyo (JP)

( * ) Notice: Subject to any disclaimer, the term of this patent is extended or adjusted under 35 U.S.C. 154(b) by 0 days.

(21) Appl. No.: 09/511,912

(22) Filed: Feb. 23, 2000

(65) Prior Publication Data
US 2002/0144643 A1    Oct. 10, 2002

(30) Foreign Application Priority Data
Mar. 1, 1999  (JP) ................. 11-052376

(51) Int. Cl.
C30B 25/12  (2006.01)
C30B 25/14  (2006.01)

(52) U.S. Cl. ............... 117/92; 117/84; 117/95; 117/103

(58) Field of Classification Search ......... 117/106, 117/934, 103, 108, 84, 89, 92, 93, 95, 105
See application file for complete search history.

(56) References Cited

U.S. PATENT DOCUMENTS

| | | | |
|---|---|---|---|
| 4,171,234 A | | 10/1979 | Nagata et al. |
| 4,241,109 A | * | 12/1980 | Johnson ............... 427/162 |
| 5,068,203 A | | 11/1991 | Logsdon et al. |
| 5,084,409 A | * | 1/1992 | Beam, III et al. ........ 437/80 |
| 5,120,393 A | * | 6/1992 | Kubo et al. ............. 156/601 |
| 5,425,808 A | * | 6/1995 | Tokanaga et al. ........ 117/95 |
| 5,661,076 A | * | 8/1997 | Yoo et al. .............. 438/39 |
| 5,846,320 A | * | 12/1998 | Matsuyama et al. ...... 117/90 |
| 5,853,478 A | * | 12/1998 | Yonehara et al. ........ 117/89 |
| 6,051,849 A | * | 4/2000 | Davis et al. ............ 257/103 |
| 6,103,019 A | * | 8/2000 | Saxena .................. 148/33 |
| 6,121,121 A | * | 9/2000 | Koide ................... 438/481 |
| 6,123,768 A | * | 9/2000 | Moustakas ............. 117/105 |
| 6,377,596 B1 | * | 4/2002 | Tanaka et al. ........... 372/45 |
| 6,399,473 B1 | | 6/2002 | Fischer et al. |
| 2002/0011599 A1 | * | 1/2002 | Motoki et al. .......... 257/76 |
| 2002/0022290 A1 | * | 2/2002 | Kong et al. ............. 438/48 |

FOREIGN PATENT DOCUMENTS

DE    19729186    1/1999

(Continued)

OTHER PUBLICATIONS

English Translation of Korean Office Action dated Jan. 31, 2002.

(Continued)

*Primary Examiner*—Felisa Hiteshew
(74) *Attorney, Agent, or Firm*—Stevens, Davis, Miller & Mosher, LLP

(57) ABSTRACT

A method for forming a single crystalline film including the steps of forming an amorphous film on a single crystalline substrate, forming an opening in the amorphous film and thereby exposing a part of a surface of the substrate, and introducing atomic beams, molecular beams or chemical beams onto the surface of the substrate at their incident angle of not more than 40 degrees with respect to the substrate surface under a reduced atmosphere and thereby selectively and epitaxially growing a single crystalline film on the exposed surface of the substrate and then in a lateral direction parallel to the surface of the substrate on the amorphous film.

17 Claims, 3 Drawing Sheets

FOREIGN PATENT DOCUMENTS

| | | |
|---|---|---|
| JP | 61271817 | 12/1986 |
| JP | 1161822 | 6/1989 |
| JP | 01-234389 A * | 9/1989 |
| JP | 40-3208887 A * | 9/1991 |
| JP | 6105797 | 12/1994 |
| KR | 927082 | 4/1992 |

OTHER PUBLICATIONS

German Office Action dated Jun. 21, 2004 with English translation.

H. Gossner, et al.; "Self-Organizing Growth of Nanometer Mesa Structures on Silicon (100) Substrates", Jpn. J. Appln. Phys. vol. 33 (1994) pp. 2268-2271, Part 1, No. 4B, Apr. 1994.

B-Y. Tsaur, et al.; "Low-dislocation-density GaAs epilayers grown on Ge-coated Si substrates by means of lateral epitaxial overgrowth", Appln. Phys. Lett. 41(4), Aug. 15, 1982, pp. 347-349.

Y. Matsunaga, et al.; "Microchannel Epitaxy of GaAs ON Si(100) Substrates Using $SiO_2$ Shadow Masks", Electrochemical Society Proceedings vol. 97-21 (1997), pp. 184-188.

* cited by examiner

METHOD FOR FORMING A SINGLE CRYSTALLINE FILM

BACKGROUND OF THE INVENTION

1. Field of the Invention

This invention relates a method for forming a single crystalline film, and more particularly the method suitable for the fabrication of electronic devices, optical devices, integrated devices and opto-electronic integrated devices.

2. Description of the Related Art

A technique of forming a single crystalline film on a single crystalline substrate is very often employed for integrated circuits, electronics devices and optical devices. The single crystalline film is formed through an epitaxial growth using atomic and molecular beams on the single crystalline substrate.

On account of a difference in lattice constant between the single crystalline substrate and the single crystalline film and of dislocations included in the substrate itself, the film epitaxially grown on the substrate often includes many dislocations. It is preferable to eliminate dislocations because they cause the life time of the devices to be degraded and the device-characteristics to be fluctuated.

The inventor has disclosed, what is called, a micro-channel epitaxy technique in Japanese Patent Publication Kokai Hei 1-161822 and Kokoku Hei 6-105797.

Following the technique, an amorphous insulating film is formed on a single crystalline substrate and a strip opening is formed in the film to epitaxially grow a single crystalline film therein. Then, after the opening was buried by the crystalline film, the crystalline film in the opening serves as a seed for a single crystalline film growing epitaxially in a lateral direction parallel to a surface of the substrate to form the epitaxially grown single crystalline film on the amorphous film.

Most of the dislocations in the substrate do not propagate in the parallel direction in the grown single crystalline film, so that the grown single crystalline film formed on the amorphous film can have much less dislocations.

However, since a liquid phase epitaxy method has been employed in the above technique, it is difficult to form a uniform film on a large-scale substrate. Thus, the technique is not sufficient for using in a real semiconductor-manufacturing site and for realizing the above mentioned devices. Consequently, a technique to make possible a micro-channel epitaxy through a vapor phase epitaxy such as the molecular beam epitaxy (MBE), a metalorganic vapor phase epitaxy (MOVPE) or a halide source epitaxy is desired.

SUMMARY OF THE INVENTION

It is an object of the present invention to provide a new method for forming a single crystalline film on a single crystalline substrate by the micro-channel epitaxy technique via the vapor phase epitaxy.

This invention provides to a method for forming a single crystalline film comprising the steps of:

forming an amorphous film on a single crystalline substrate, forming an opening in the amorphous film and thereby exposing a part of a surface of the substrate, and introducing atomic beams or molecular beams onto the surface of the substrate at their incident angle of not more than 40 degrees under a reduced atmosphere and thereby selectively and epitaxially growing a single crystalline film on the exposed surface of the substrate.

The inventor investigated hard to realize the micro-channel epitaxy with the vapor phase epitaxy method. As a result, he found that by adjusting incident angles to a surface of a single crystalline substrate of atomic beams or molecular beams within a given angle range under a reduced atmosphere, atoms which constitute a single crystalline film are deposited and epitaxially grown only on an opening formed in an amorphous film, but not deposited on the amorphous film. On the basis of this finding, by continuing the epitaxial growth from the single crystalline layer formed in the opening, he has succeeded in growing the single crystalline film laterally with much less dislocations on the amorphous film by the micro-channel epitaxy.

FIG. 1 shows a cross section of a sample for explaining the method for forming a single crystalline film according to the present invention.

Following the present invention, an amorphous film 2 made of silicon oxide, etc. is formed on a single crystalline substrate 1. Then, an opening 3 having a width "W" is formed in the film 2 by etching, etc. to expose a part of the substrate 1. The opening 3 has a linear shape on the substrate 1, elongating in a direction perpendicular to the cross section shown in FIG. 1.

Then, according to the present invention, for example, atomic and/or molecular beams (hereafter only molecular beams are described) are introduced to a surface 1A of the substrate 1 at their incident angle θ within 40 degrees under a reduced atmosphere. Just then, incident molecular beams 6-1 and 6-3 on the amorphous film 2 are reflected in a direction shown by arrows or the decomposed atoms are re-evaporated without being deposited on the amorphous film 2. On the other hand, an incident molecular beam 6-2 on the opening 3 is almost not reflected, and atoms composing the beam 6-2 are deposited onto the substrate 1 and are epitaxially grown. Consequently, a single crystalline film 4 is formed selectively only on the opening 3.

On continuing the selective epitaxial growth on the opening 3, the single crystalline film 4 gains its thickness and a single crystalline film 7 thicker than the amorphous film 2 is formed, as shown in FIG. 2. The incident beams 6-1 and 6-3 are reflected or the decomposed atoms are re-evaporated without being deposited onto the amorphous film 2 as in FIG. 1. On the other hand, the incident molecular beams 6-2 and 6-5 are almost not reflected by an upper surface 7A and a side face 7B of the single crystalline film 7, and the atoms composing the beams continue to be epitaxially grown on the both 7A and 7B surfaces of film 7 the latter of which serves as a seed for epitaxial lateral overgrowth.

Thus, the epitaxial growth goes on not only in a direction perpendicular to the surface 1A of the single crystalline substrate 1, but also in a direction parallel thereto. As a result, as shown in FIG. 3, a single crystalline film 8 grown in the vertical direction and a lateral single crystalline film 9 grown on the amorphous film 2 in the lateral direction are formed.

Accordingly, even if dislocations are generated in the single crystalline films 4 and 7 because of lattice mismatch between the single crystalline substrate 1 and the single crystalline films 4, 7 or even if dislocations are present in the substrate 1, they propagate in a direction almost perpendicular to the surface 3 of the substrate 1 and not in a direction parallel to the surface. Thus, the single crystalline film 8 shown in FIG. 3 may have dislocations, but the single crystalline film 9 formed laterally on the amorphous film 2 has no dislocations. Consequently, a single crystalline film having much less dislocations can be formed by the micro-channel epitaxy technique via the vapor phase epitaxy.

As above-mentioned, according to the present invention, the single crystalline film having much less dislocations can be formed by the micro-channel epitaxy technique through the vapor phase epitaxy. Thus, the method according to the present invention can be really employed in a semiconductor manufacturing site and provide a forming method of a single crystalline film usable for realizing integrated circuits.

BRIEF DESCRIPTION OF THE DRAWINGS

The invention will be more accurately described with reference to the accompanying drawings.

DESCRIPTION OF THE PREFERRED EMBODIMENTS

The invention will be described in detail as follows.

The forming method according to the present invention requires that an amorphous film be formed on a single crystalline substrate and an opening be formed in the amorphous film to expose a part of a surface of the substrate.

Figure 1:
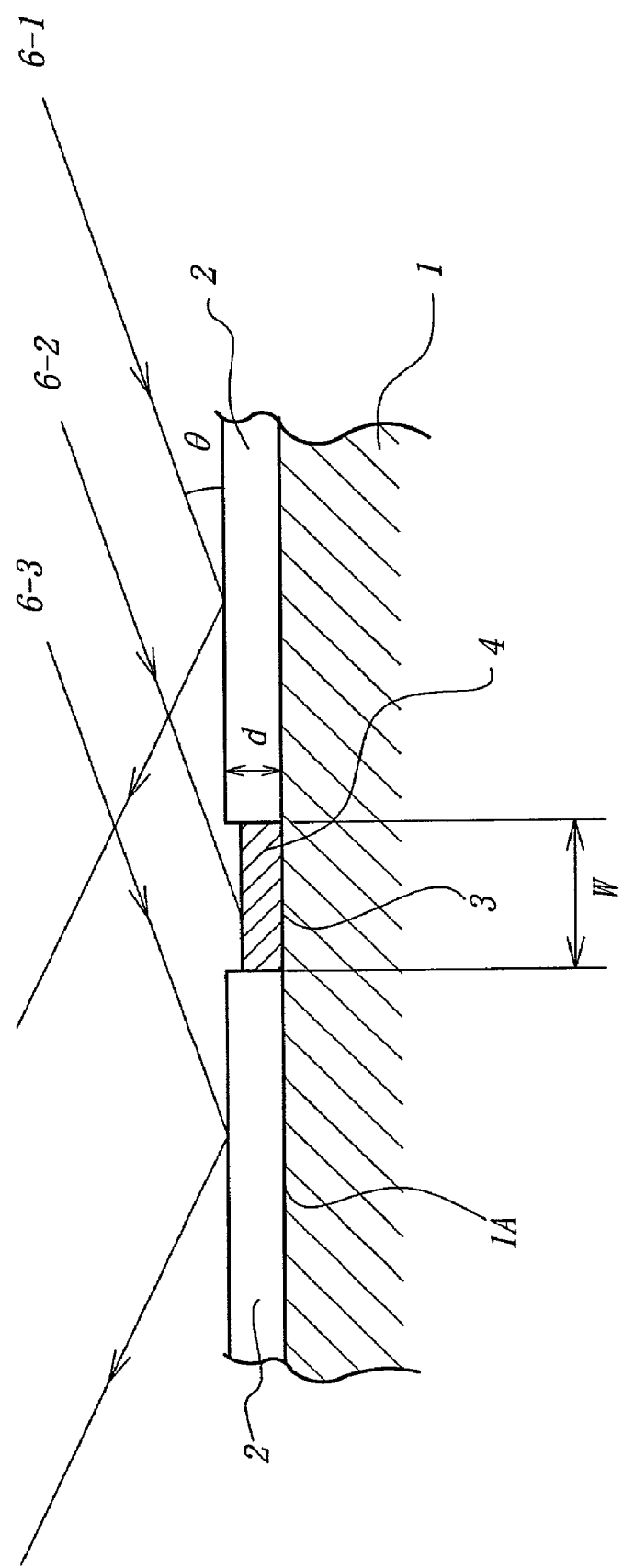
FIG. 1 gives a general view for explaining a method for forming a single crystalline film according to the present invention, FIG. 2 does a general view for explaining the next step of the growth followed by the growth shown in FIG. 1.
Figure 2:
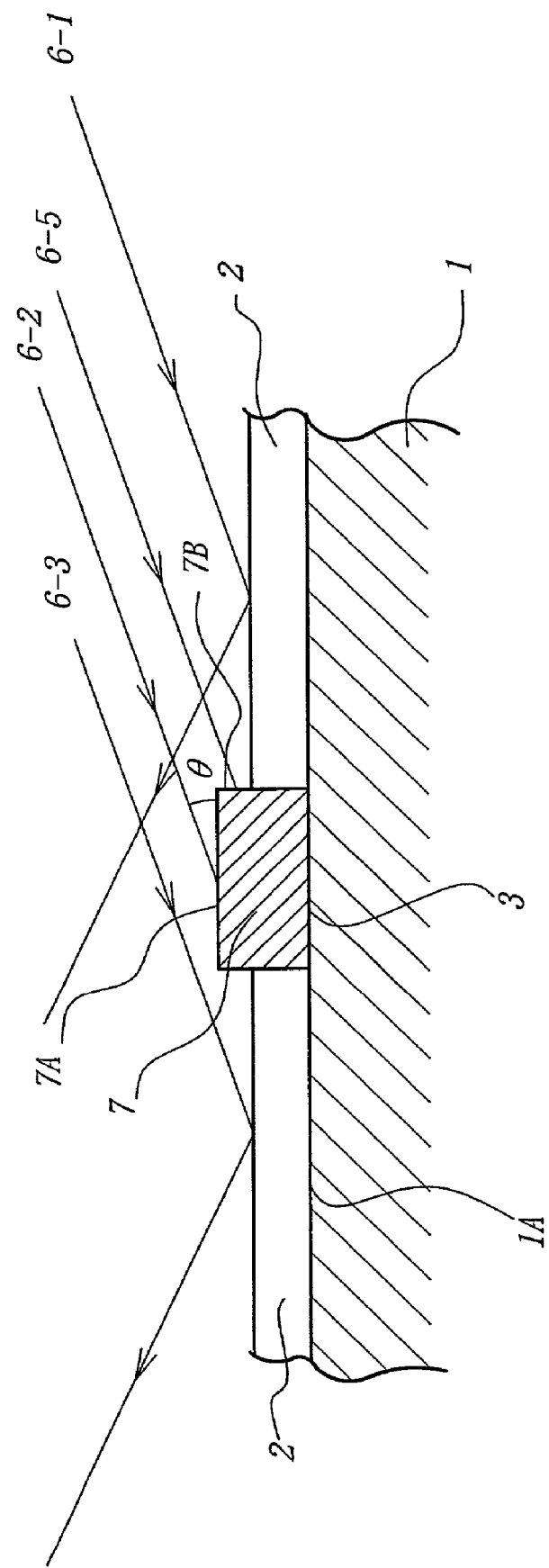
Figure 3:
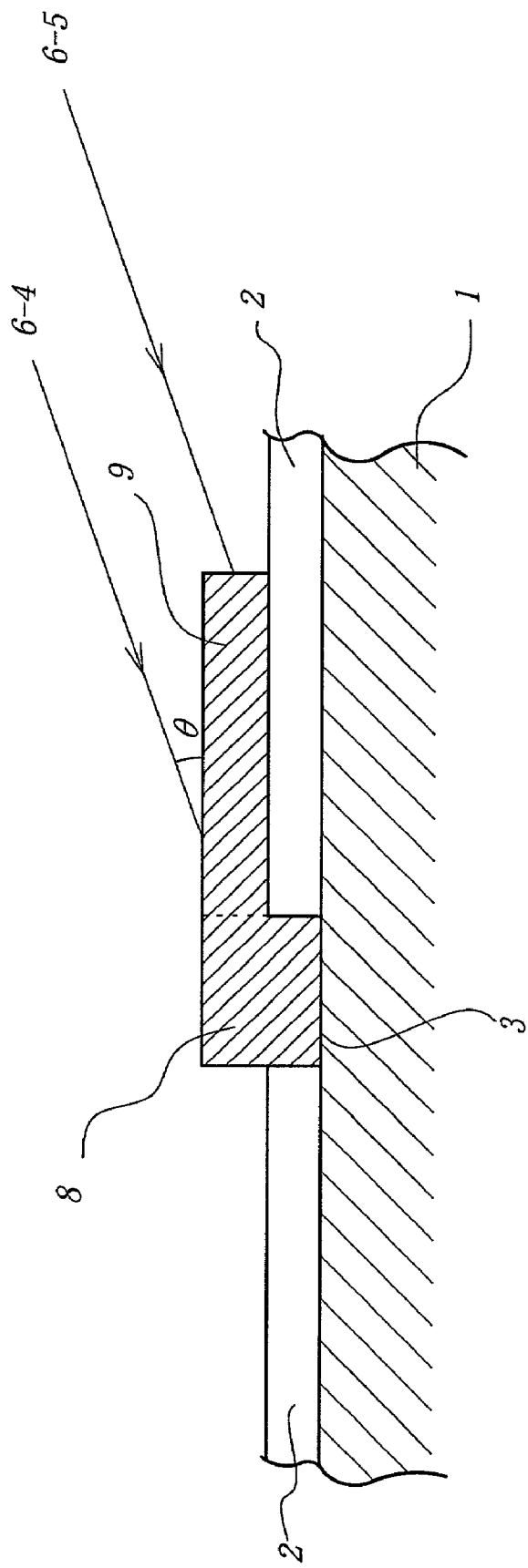
FIG. 3 shows a general view for explaining a step followed by the growth shown in FIG. 2.

The opening is not particularly limited in its shape, but has preferably a linear shape or a rectangular shape, more particularly the linear shape as the cross section of which is shown in FIG. 1. As a result, the lateral single crystalline film 9 as shown in FIG. 3 can be formed uniformly on the amorphous film 2 from the single crystalline film 7 which serves as a seed for the film 9.

The opening 3 as shown in FIG. 1 has preferably a width "W" of 0.001 µm to 10 µm, particularly 0.005 µm to 10 µm, more particularly 0.005 µm to 1 µm. Thereby, the molecular beam 6-2 can be introduced to the opening 3 and the single crystalline film 7 which serves as a seed for the single crystalline film 9 can be grown.

Moreover, the opening is not particularly limited in its forming method, but may be formed by a micro-processing technique such as a photolithography, an electron beam lithography and X-ray lithography.

The single crystalline substrate usable for the present invention is not particularly restricted. Every kind of single crystalline substrate may be used, depending on a kind of the single crystalline film to be selectively and epitaxially grown. For example, silicon (Si) single crystalline substrate, gallium arsenide (GaAs) single crystalline substrate, zinc selenide (ZnSe) single crystalline substrate, sapphire single crystalline substrate, etc. may be used as the single crystalline substrate according to the present invention.

A material composing the amorphous film is not limited. Every kind of material may be used, depending on a use of an assembly including the single crystalline film which are formed according to the present invention and the single crystalline substrate.

For example, by composing the amorphous film of an insulating material such as a silicon oxide material and a silicon nitride material, what is called, an assembly having a SOI (Semiconductor on Insulator) structure can be formed. Thus, the assembly may be applied for a field effect transistor, a hetero-bipolar transistor and an integrated circuit.

On the other hand, by using a high melting point-metal such as tantalum instead of the amorphous insulating film, an assembly having a structure of metal embedded in a semiconductor material may be formed. Such an assembly can be applied for very high frequency electron devices.

The present method requires that atomic beams or molecular beams be introduced onto a surface of the single crystalline substrate with a mask at their incident angle within 40 degrees under a reduced atmosphere. Moreover, the incident angle is preferably not more than 30 degrees, particularly not more than 25 degrees, more particularly not more than 20 degrees. Thereby, a uniform single crystalline film can be selectively and epitaxially grown on the exposed part of the substrate.

The lower limited value of the incident angle is not particularly restricted only if the single crystalline film can be epitaxially grown in the opening. However, for example, in the case of forming the amorphous film 2 having the linear opening 3 as shown in FIG. 1 on the single crystalline substrate 1, the amorphous film 2 has a thickness d of 0.001 µm to 2 µm in general, and the opening 3 has a width W of 0.001 µm to 10 µm in general, as above-mentioned. Thus, for introducing the molecular beam 6-2, the incident angle of the molecular beam 6-2 is preferably not less than 5 degrees, particularly not less than 3 degrees.

The atomic beams or the molecular beams are selected, depending on a forming method of a single crystalline film. For example, in the case of forming a silicon single crystalline film, silicon atomic beam is introduced onto a single crystalline substrate with a mask to form the silicon single crystalline film by a ultra-high vacuum molecular beam epitaxy equipment. Moreover, in the case of forming a GaAs single crystalline film, Ga atomic beam and $As_2$ or $As_4$ molecular beam are introduced onto a single crystalline substrate with a mask to form the GaAs single crystalline film.

As for the level of the vacuum employed, there is no special requirement and it is determined depending on the method for forming a single crystalline film as above-mentioned. For example, in the case of using the ultra-high vacuum molecular beam epitaxy equipment, the interior space of the equipment is preferably evacuated to a pressure of about $10^{-7}$ Torr to $10^{-11}$ Torr. Furthermore, in the case of using a chemical molecular beam epitaxy equipment, the interior space of the equipment is preferably evacuated to a pressure of about $10^{-3}$ Torr to $10^{-9}$ Torr.

The forming method of the present invention can be employed for forming every kind of single crystalline film. For example, the forming method is preferably used for forming group IV semiconductors and III–V semiconductor compounds and semiconductor alloys such as a silicon single crystalline film, a GaAs single crystalline film, a GaN single crystalline film, $Ga_{1-x}Al_xAs$, II–VI semiconductor compounds and semiconductor alloys such as a ZnSe single crystalline film, a ZnS single crystalline film, a CdTe single crystalline film, and $ZnS_{1-x}Se_x$, and an single crystalline oxide film such as YBCO (Y—Ba—Cu oxide).

The single crystalline film made of a III–V semiconductor compound is formed by the MBE method or a reduced vapor phase epitaxy method, for example. In this case, group III atomic beams such as of Ga, Al, In, etc. or molecular beams containing group III elements such as metalorganic molecular beams which contain group III elements such as of $Ga(CH_3)_3$ (TMG), $Al(C_2H_5)_3$ (TEAl), $In(CH_3)_3$ (TMIn), and halide molecular beams which contain group III elements such as of $GaCl_3$, $AlCl_3$, $InCl_3$ are employed. Besides, group V molecular beams such as of $As_2$, $P_2$, $Sb_4$, etc. or molecular beams which contain group V elements such as metalorganic molecular beams, for example, of $As(CH_3)_3$ (TMAs), As($C_2H_5$)$_3$ (TEAs), P($CH_3$)$_3$ (TMP), etc., molecular hydride beams which contain group V elements such as of $AsH_3$, $PH_3$, $NH_3$, etc., and halide molecular beams which contain group V elements such as of $AsCl_3$, $PCl_3$, $SbCl_3$, etc. are employed. The group III atomic beams or the molecular beams containing group III elements and the group V molecular beams or the molecular beams containing group V elements are introduced onto a single crystalline substrate heated to a given temperature. Thereafter, for example, the group III elements and the group V elements constituting the molecular beams react to each other to form the III–V semiconductor compound.

In this case, the molecular beams containing group III elements and group V elements are introduced onto a surface of the single crystalline substrate at their incident angle within 40 degrees, respectively, and a single crystalline film made of the III–V semiconductor compound may be formed in the openings of the amorphous film by the selective epitaxial growth.

In the case of forming the single crystalline film of the III–V semi-conductor compound, however, only the group V molecular beams or the group V element-containing molecular beams can be introduced onto the surface of the single crystalline substrate at their incident angle within 40 degrees, preferably within 30 degrees, more preferably within 25 degrees, and much more preferably within 20 degrees. Thereby, even if the group m atomic beams or the group III element-containing molecular beams are introduced onto the surface at their any incident angles, the single crystalline film made of the III–V semiconductor compound can be formed in the opening. The reason is that the group V elements contained in the molecular beams govern nucleation process in the growth of the III–V semiconductor compound.

The single crystalline film made of a II–VI semiconductor compound is formed by the MBE method or the reduced vapor phase epitaxy method as above-mentioned. In this case, group II atomic beams such as of Zn, Cd, Hg, etc. or molecular beams containing group II elements such as metalorganic molecular beams, for example, of Zn($CH_3$)$_2$, Zn($C_2H_5$)$_2$, Cd($CH_3$), etc. and halide molecular beams containing group II elements such as of $ZnCl_2$, $CdCl_2$, $HgCl_2$, etc. are employed. Besides, group VI atomic beams such as of S, Se, Te, etc. or molecular beams containing group VI elements such as metalorganic molecular beams, for example, of Te($CH_3$)$_2$, Te($C_2H_5$)$_2$, Se($CH_3$)$_2$, etc. are employed. The group II atomic beams or molecular beams containing group II elements and the molecular beams containing group II elements or molecular beams containing group VI elements are introduced onto a single crystalline substrate heated to a given temperature. Thereafter, the group II elements and the group VI elements contained in the molecular beams react to each other to form the film of the II–VI semiconductor compounds.

In this case, the molecular beams containing group II elements and group VI elements are introduced onto a surface of the single crystalline substrate at their incident angle within 40 degrees, respectively, and a single crystalline film made of the II–VI semiconductor compound is formed in the openings of the amorphous film and then laterally over it by the selective epitaxial growth.

In the case of forming the single crystalline film of the II–VI semiconductor compound, however, only at least one of the group II atomic beams or the group II element-containing molecular beams and the group VI atomic beams or the group VI element-containing molecular beams may be introduced onto the surface of the single crystalline substrate at their incident angles within 40 degrees, preferably within 30 degrees, more preferably within 25 degrees, and much more preferably within 20 degrees. Thereby, the group VI element containing beams and the group II element-containing beams, can be introduced onto the surface at their any incident angles, respectively for low angle incident group II element-containing beam and group VI element-containing beam to form the single crystalline film made of the II–VI group semiconductor compound in the opening. The reason is that the group II elements or the group VI elements contained in the beams determine the rate of nucleation of the film of the II–VI semiconductor compound.

In the case of forming the single crystalline film made of the abovementioned III–V semiconductor compound or the II–VI semiconductor compound, continuation of the epitaxial growth in the opening 3 enables to give the epitaxial film 9 in FIG. 3 in a lateral direction parallel to the surface of the substrate.

Thus, as shown in FIG. 3, the lateral single crystalline film 9 made of the III–V semiconductor compound or the like can be formed on the amorphous film 2.

The lateral single crystalline film formed on the amorphous film according to the present invention has a dislocation density of not more than $10^4/cm^2$, particularly not more than $10^2/cm^2$. Even if a difference in lattice constant between the single crystalline substrate and the single crystalline film is relatively large and in the range of 0.1% to 30%, the single crystalline film having a low dislocation density can be obtained constantly according to the present invention.

EXAMPLES

Example 1

A silicon oxide film was formed in a thickness of 200 nm on a silicon single crystalline substrate having a diameter of 50 mm and a thickness of 0.5 mm by a plasma CVD method. Then, a linear opening having a width of 1 μm as shown in FIG. 1 was formed by photolithography to expose a part of a surface of the substrate.

After oxide films in the exposed surface of the substrate were removed by heating, $SiH_4$ molecular beams were introduced onto the surface of the substrate at their incident angle of 20 degrees by using a gas source-molecular beam epitaxy equipment with the substrate being kept at a temperature of 950° C. Then, the decomposed Si atoms were selectively and epitaxially grown in the openings to form a single crystalline film therein.

Thereafter, when the epitaxial growth was continued by successively introduction of the molecular beams, the epitaxial growth occurred in a direction parallel to the surface of the substrate to form a single crystalline film on the silicon oxide film at the time when the single crystalline film was thicker than the silicon oxide film. The single crystalline film formed on the silicon oxide film had a thickness of 0.2 μm.

When the single crystalline film was characterized by a reflection high energy electron diffraction method, it turned out that the film was composed of silicon single crystal. Moreover, when the film was chemically etched, etch-pits did not appear in the film. Then, the film was characterized by a transmission electron microscope and the dislocation density of the film was found not more than $10^2/cm^2$.

Example 2

Except that silicon atomic beams were introduced onto the silicon single crystalline substrate with mask at their incident angle of 10 degrees by an ultra-high vacuum molecular beam epitaxy equipment, the growth was carried out as described in Example 1.

A single crystalline film formed on the silicon oxide film had a thickness of 0.2 μm. Moreover, when the film was characterized by a reflection high energy electron diffraction, it turned out that the film was composed of silicon single crystal. When the film was chemically etched, etch-pits did not appear in the film. Then, the film was characterized by a transmission electron microscope and the dislocation density of the film was found not more than $10^2/cm^2$.

Example 3

Except that a Ta film having a thickness of 20 nm instead of the silicon oxide film was formed, the growth was carried out as described in Example 1.

A single crystalline film formed on the Ta film had a thickness of 0.2 μm. The film was investigated by a reflection high energy electron diffraction. It turned out that the film was composed of silicon single crystal. When the film was chemically etched, etch-pits did not appear in the film. Then, the film was characterized by a transmission electron microscope and the dislocation density of the film was found not more than $10^2/cm^2$.

Except that a Ta film having a thickness of 20 nm instead of the silicon oxide film was formed, the growth was carried out as described in Example 2.

A single crystalline film formed on the Ta film had a thickness of 0.2 μm. The film was investigated by a reflection high energy electron diffraction. It turned out that the film was composed of silicon single crystal. When the film was chemically etched, etch-pits did not appear in the film. Then, the film was characterized by a transmission electron microscope and the dislocation density of the film was found not more than $10^2/cm^2$.

Example 5

A silicon oxide film was formed in a thickness of 200 nm on a GaAs single crystalline substrate having a diameter of 50 mm and a thickness of 0.5 mm by a plasma CVD method. Then, a linear opening having a width of 1 μm was formed by the same manner as described in Example 1.

Then, the substrate was put into a MBE equipment and $As_4$ molecular beams and Ga atomic beams were introduced into the opening at incident angles of 20 degrees and 40 degrees, respectively, with respect to the surface of the substrate which was kept at a temperature of 610° C. The atoms constituting the molecular beams were selectively and epitaxially grown in the openings to form a single crystalline film of GaAs.

Thereafter, the epitaxial growth was continued by successive introduction of the atomic and the molecular beams and the epitaxial growth was found to occur in a lateral direction parallel to the surface of the substrate to form a single crystalline film on the silicon oxide film at the time when the single crystalline film became thicker than the silicon oxide film. The single crystalline film formed on the silicon oxide film had a thickness of 0.5 μm.

When the single crystalline film was characterized by a reflection high energy electron diffraction, it turned out that the film was composed of GaAs single crystal. When the film was chemically etched, etch-pits did not appear in the film. Then, the film was characterized by a transmission electron microscope and the dislocation density of the film was found not more than $10^2/cm^2$.

Example 6

Except that a silicon single crystalline substrate having a diameter of 50 mm and a thickness of 0.5 mm was used and natural oxide films on a surface of the substrate were removed by heating the substrate to a temperature of 1000° C. before forming a single crystalline film in an opening, the growth was carried out as described in Example 5.

The single crystalline film formed on the silicon oxide film had a thickness of 0.5 μm. When the single crystalline film was characterized by a reflection high energy electron diffraction, it turned out that the film was composed of GaAs single crystal. Moreover, when the film was chemically etched, etch-pits did not appear in the film. Then, the film was characterized by a transmission electron microscope and the dislocation density of the film was found not more than $10^2/cm^2$.

Example 7

A ZnSe single crystalline substrate having an area of 1 $cm^2$ and a thickness of 0.5 mm was employed and a silicon oxide film was formed in a thickness of 200 nm on the substrate by a plasma CVD method. Then, a linear opening having a width of 1 μm was formed by the same manner as in Example 1 to expose a part of a surface of the substrate.

Then, the single crystalline substrate was put into a MBE equipment and Se atomic beam and Zn atomic beam were introduced into the opening at their incident angles of 20 degrees and 40 degrees, respectively, with respective to the surface of the substrate which was heated to a temperature of 500° C. Then, the atoms constituting the molecular beams were selectively and epitaxially grown in the openings to form a single crystalline film of ZnSe.

Thereafter, the epitaxial growth was continued by successive introduction of the atomic beams and the epitaxial growth occurred in a lateral direction parallel to the surface of the substrate to form a single crystalline film on the silicon oxide film at the time when the single crystalline film became thicker than the silicon oxide film. The single crystalline film formed on the silicon oxide film had a thickness of 0.2 μm.

When the single crystalline film was characterized by a reflection high energy reflection electron diffraction method, it turned out that the film was composed of ZnSe single crystal. Moreover, when the film was chemically etched, etch-pits did not appear in the film. Then, the film was characterized by a transmission electron microscope and the dislocation density of the film was found not more than $10^2/cm^2$.

Example 8

A $SrTiO_3$ single crystalline substrate having an area of 1 $cm^2$ and a thickness of 0.5 mm was employed and a silicon oxide film was formed in a thickness of 200 nm on the substrate by a plasma CVD method. Then, a linear opening having a width of 1 μm was formed by the same manner as in Example 1 to expose a part of a surface of the substrate.

Then, the single crystalline substrate was put into a MBE equipment. Y, Ba and Cu atomic beams were introduced into the opening at their incident angles of 20 degrees, and oxygen molecular beams containing ozone molecules were introduced into the opening at their incident angle of 30 degrees with respect to the surface of the substrate which was heated to 800° C. Then, the atoms constituting the molecular beams were selectively and epitaxially grown in the openings to form a single crystalline film of YBCO.

Thereafter, the epitaxial growth was continued by successively introduction of the atomic beams and the molecular beams and the epitaxial growth occurred in a lateral direction parallel to the surface of the substrate to form a single crystalline film on the silicon oxide film at the time when the single crystalline film became thicker than the silicon oxide film. The single crystalline film formed on the silicon oxide film had a thickness of 0.2 μm.

When the single crystalline film was characterized by a reflection high energy electron diffraction method, it turned out that the film was composed of YBCO single crystal. Moreover, when the film was chemically etched, etch-pits did not appear in the film. Then, the film was characterized by a transmission electron microscope and the dislocation density of the film was found not more than $10^2/cm^2$.

As is apparent from the above examples, according to the present invention, the single crystalline film having much less dislocations, for example, a dislocation density of not more than $10^2/cm^2$ can be formed on the amorphous film such as the silicon oxide film or the Ta film.

Although this invention was described in detail with reference to the above examples, this invention is not limited to the above disclosure and every kind of variation and modification may be made without departing from the scope of the present invention.

According to the present invention, a single crystalline film can be selectively formed only in a given opening. Thus, using the film as a seed, a micro-channel epitaxy can be carried out by a vapor phase epitaxy. As a result, a single crystalline film having less dislocations, which is usable for a real site of semiconductor-manufacturing and for realizing integrated circuits, electronic elements, optical elements and the like, can be provided.

What is claimed is:

1. A method for forming a single crystalline film comprising:
    forming an amorphous film on a single crystalline substrate,
    forming an opening in the amorphous film and thereby exposing a part of a surface of the substrate through the opening, and
    directing an atomic beam, a molecular beam, or a chemical beam toward the substrate at an incident angle of not more than 40 degrees with respect to the substrate surface to selectively and epitaxially grow a single crystalline film on the exposed surface of the substrate that laterally overgrows the amorphous film.

2. A method for forming a single crystalline film as defined in claim 1, wherein the atomic beams, the molecular beams or the chemical beams are introduced at their incident angle of not more than 25 degrees.

3. A method for forming a single crystalline film as defined in claim 1, wherein atomic beams composed of group V elements in the periodic table, molecular beams or chemical beans containing group V elements in the periodic table are introduced onto the surface of the single crystalline substrate at their incident angle of not more than 40 degrees and atomic beams composed of group III elements in the periodic table, molecular beams or chemical beams containing group III elements in the periodic table are introduced onto the surface of the single crystalline substrate at their any incident angles, and thereby a single crystalline film made of a III–V semiconductor compound is selectively and epitaxially grown on the exposed surface of the substrate.

4. A method for forming a single crystalline film as defined in claim 3, wherein the atomic beams composed of group V elements in the periodic table, the molecular beams or the chemical beams containing group V elements in the periodic table are introduced at their incident angle of not more than 25 degrees.

5. A method for forming a single crystalline film as defined in claim 1, wherein atomic beams composed of group III elements in the periodic table, molecular beams or chemical beams containing group III elements in the periodic table are introduced onto the surface of the single crystalline substrate at their incident angle of not more than 40 degrees and atomic beams composed of group V elements in the periodic table, molecular beams or chemical beams containing group V elements in the periodic table are introduced onto the surface of the single crystalline substrate at their any incident angles, and thereby a single crystalline film made of a III–V semiconductor compound is selectively and epitaxially grown on the exposed surface of the substrate.

6. A method for forming a single crystalline film as defined in claim 5, wherein the atomic beams composed of group III elements in the periodic table, the molecular beams or the chemical beams containing group III elements in the periodic table are introduced at their incident angle of not more than 25 degrees.

7. A method for forming a single crystalline film as defined in any one of claims 1 to 6, wherein the opening has a linear shape and has a width of 0.001 μm to 10 μm.

8. A method for forming a single crystalline film as defined in any one of claims 1 to 6, wherein the amorphous film is made of an insulating material or a high melting point-metal.

9. A method for forming a single crystalline film as defined in any one of claims 1 to 6, wherein the single crystalline film is epitaxially grown, from the single crystalline film as a seed which is selectively and epitaxially grown on the exposed surface of the substrate, in a lateral direction parallel to the surface of the substrate on the amorphous film.

10. A method for forming a single crystalline film as defined in claim 9, wherein lattice constants of the single crystalline substrate and the single crystalline film are different from each other.

11. A method for forming a single crystalline film as defined in claim 10, therein a difference in lattice constant between the single crystalline substrate and the single crystalline film is 0.1% to 30%.

12. A method for forming a single crystalline film as defined in claim 1, wherein the single crystalline substrate and the atomic beams, molecular beams or chemical beams are of different materials.

13. The method of claim 1, wherein:
    the single crystalline film and a surface layer of the single crystalline substrate, upon which the single crystalline film is formed, have different molecular structures;
    the molecular structure of the single crystalline film is not an alloy of the molecular structure of the surface layer of the single crystalline substrate; and
    the molecular structure of the surface layer of the single crystalline substrate is not an alloy of the molecular structure of the single crystalline film.

14. The method of claim 13, wherein:

the single crystalline substrate is formed from one of the group of Si, GaAs, ZnSe, SrTiO$_3$, and sapphire; and the single crystalline film is formed from one of the group of Si, GaAs, Ga$_{1-x}$Al$_x$As, ZnSe, ZnS, CdTe, ZnS$_{1-x}$Se$_x$, and YBCO.

15. The method of claim 13 wherein:

the single crystalline substrate is toned from one of the group of Si, GaAs, ZnSe, and SrTiO$_3$; and the single crystalline film is formed from one of the group of Si, Gait GaAs, Ga$_{1-x}$Al$_x$As, ZnSe, ZnS, CdTe, ZnS$_{1-x}$Se$_x$, and YBCO.

16. The method of claim 1, wherein:

the single crystalline substrate is formed from one of the group of Si, GaAs, ZnSe, SrTiO$_3$, and sapphire; and the single crystalline film is formed from one at the group of Si, GaAs, Ga$_{1-x}$A$_x$As, ZnSe, ZnS, CdTe, ZnS$_{1-x}$Se$_x$, and YBCO.

17. The method of claim 1, wherein:

the single crystalline substrate is formed from one of the group of Si, GaAs, ZnSe, and SrTiO$_3$; and the single crystalline film is formed from one of the group of Si, GaN, GaAs, Ga$_{1-x}$Al$_x$As, ZnSe, ZnS, CdTe, ZnS$_{1-x}$Se$_x$, and YBCO.

* * * * *